United States Patent
deVilliers et al.

(10) Patent No.: US 8,748,321 B2
(45) Date of Patent: *Jun. 10, 2014

(54) METHOD FOR EPITAXIAL DEVICES

(71) Applicant: Micron Technology, Inc., Boise, ID (US)

(72) Inventors: Anton deVilliers, Boise, ID (US); Erik Byers, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/901,767

(22) Filed: May 24, 2013

(65) Prior Publication Data

US 2013/0256692 A1    Oct. 3, 2013

Related U.S. Application Data

(60) Continuation of application No. 13/528,574, filed on Jun. 20, 2012, now Pat. No. 8,450,776, which is a division of application No. 12/826,275, filed on Jun. 29, 2010, now Pat. No. 8,216,943.

(51) Int. Cl.
    *H01L 21/311*    (2006.01)

(52) U.S. Cl.
    USPC .......... 438/694; 438/22; 438/30; 438/48; 438/689

(58) Field of Classification Search
    USPC .......... 438/22, 30, 48, 50, 689, 694; 257/14, 257/20, 88–90, 98–100
    See application file for complete search history.

(56) References Cited

U.S. PATENT DOCUMENTS

| | | | |
|---|---|---|---|
| 5,006,914 A | 4/1991 | Beetz, Jr. | |
| 6,075,577 A | 6/2000 | Crandall | |
| 8,143,646 B2 | 3/2012 | Hudait et al. | |
| 8,216,943 B2 * | 7/2012 | deVilliers et al. | 438/694 |
| 8,450,776 B2 | 5/2013 | Devilliers | |
| 2006/0019466 A1 | 1/2006 | Nayfeh et al. | |
| 2009/0213284 A1 | 8/2009 | Liao et al. | |
| 2009/0231259 A1 | 9/2009 | Yu et al. | |
| 2011/0147879 A1 | 6/2011 | Tivarus | |
| 2011/0316021 A1 | 12/2011 | deVilliers et al. | |
| 2012/0256191 A1 | 10/2012 | Devilliers et al. | |

OTHER PUBLICATIONS

Clark, Noel A, et al., "FLC microdisplays", Ferroelectrics, vol. 246, (2000), 97-110.

Handschy, Mark A, et al., "9.5L: Late-News Paper: Scalable Sequential-Color Display Without ASICs", SID Symposium Digest 38, 109, (2007), 109-112.

Handschy, Mark A, et al., "The Future of Pico Projectors", Information Display, 24(12), Projection Displays Issue, (Dec. 2008), 16-20.

* cited by examiner

*Primary Examiner* — Dung A. Le
(74) *Attorney, Agent, or Firm* — Schwegman, Lundberg & Woessner, P.A.

(57) ABSTRACT

Epitaxial growth methods and devices are described that include a textured surface on a substrate. Geometry of the textured surface provides a reduced lattice mismatch between an epitaxial material and the substrate. Devices formed by the methods described exhibit better interfacial adhesion and lower defect density than devices formed without texture. Silicon substrates are shown with gallium nitride epitaxial growth and devices such as LEDs are formed within the gallium nitride.

13 Claims, 10 Drawing Sheets

200  FIG. 2A 204  206  202  201  210

METHOD FOR EPITAXIAL DEVICES

PRIORITY APPLICATION

This application is a continuation of U.S. application Ser. No. 13/528,574, filed Jun. 20, 2012, which is a divisional of U.S. application Ser. No. 12/826,275, filed Jun. 29, 2010, now issued as U.S. Pat. No. 8,216,943, both of which are incorporated herein by reference in their entirety.

BACKGROUND

Many semiconductor devices, in particular Light Emitting Diode (LED) devices, utilize semiconductor materials other than silicon. These materials, such as gallium nitride (GaN), gallium arsenide (GaAs), gallium antimonide (GaSb) etc. can be expensive or even not available in a bulk material form. In order to utilize these materials in a cost efficient way, an epitaxial film of the desired semiconductor material is grown on a suitable substrate. However, growing a high quality epitaxial film, with low crystal defect density, is typically facilitated by using a substrate with a closely matching lattice constant.

Presently, sapphire (crystalline aluminum oxide) structures are used as substrates, but they are expensive, costing up to hundreds of dollars for a two inch wafer. It would be economically attractive, and would facilitate circuit integration, to manufacture devices such as LEDs or other semiconductor devices using a less expensive substrate material, such as silicon, to reduce production costs. However, direct epitaxial growth of GaN on a silicon surface tends to produce lower quality epitaxial films with higher defect densities, due to differing lattice constants.

BRIEF DESCRIPTION OF THE DRAWINGS

FIG. 2A shows an example block copolymer according to an embodiment of the invention.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and chemical, structural, logical, and electrical changes may be made.

The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other structures, such as silicon-on-insulator (SOI), etc. that have been fabricated thereupon. Both wafer and substrate include doped and undoped semiconductors, epitaxial semiconductor structures supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
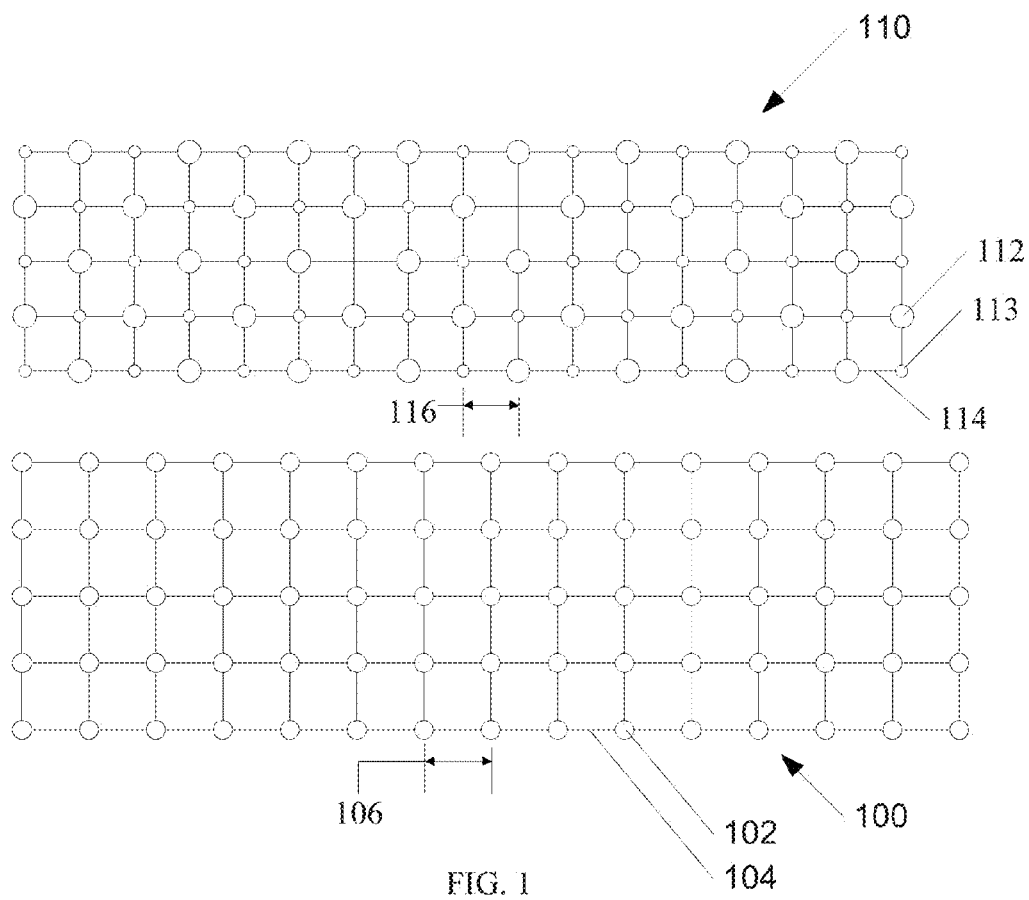
FIG. 1 shows two different semiconductor materials according to an embodiment of the invention.

FIG. 1 illustrates an example of a silicon lattice 100 and a gallium nitride lattice 110. The silicon lattice 100 includes a regular, crystalline pattern of silicon atoms 102 spaced apart by bonds 104. The silicon lattice constant is illustrated as distance 106. The gallium nitride lattice 110 includes both gallium atoms 112 and nitrogen atoms 113 with bonds 114 arranged to form the lattice 110. A gallium nitride lattice constant 116 is shown with a smaller lattice constant than the silicon lattice constant 106. It is desired to have the atoms in the gallium nitride lattice 110 line up with the silicon atoms 102 in the silicon lattice 100. When the lattice constants are different, the bonds tend to distort and create internal stresses in the materials, which can lead to unwanted defects such as dislocations, and can increase the likelihood of an unwanted fracture plane along the interface.

FIG. 2A illustrates a block copolymer molecule 200 that is used in a method that improves the interface between a substrate and an epitaxial material to reduce defects and improve strength at the interface. The block copolymer molecule 200 includes different polymer chains that are attached together. In its simplest form, as illustrated in FIG. 2A, the block copolymer includes two different polymer chains, A and B, coupled together. One of ordinary skill in the art will recognize that other, more complex block copolymers can also be used within the scope of the invention. Examples include multiple blocks such as tri-blocks, other multi-component blocks, branched copolymers, etc.

Figure 2B:
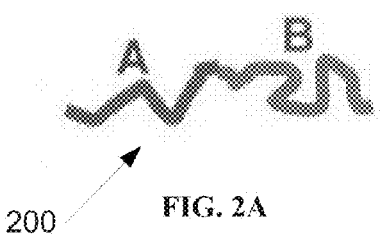
FIG. 2B shows a portion of a substrate during a manufacturing process according to an embodiment of the invention.
Figure 2B:
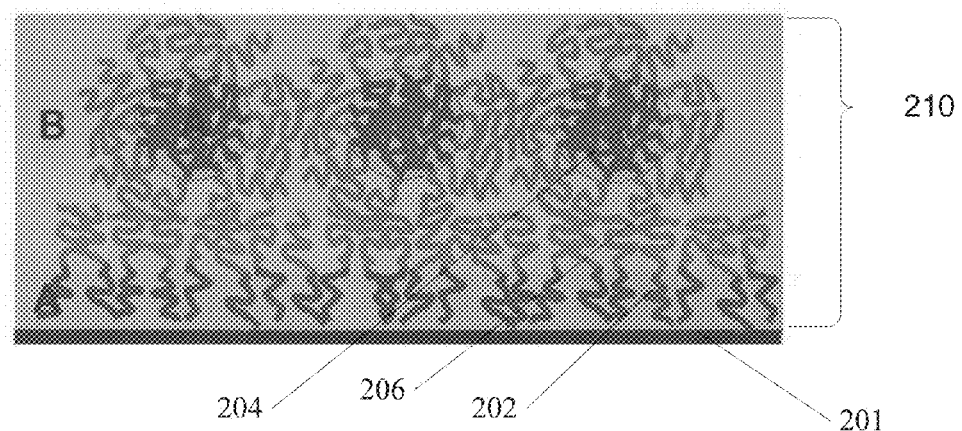

FIG. 2B illustrates a substrate 201 with an assembled block copolymer 210. The block copolymer 210 includes a first "A" region 202 assembled adjacent to the substrate 201 and a second "A" region 204 assembled at a distance away from the substrate 201 and separated from the first "A" region by a "B"

region 206. In the example illustrated in FIG. 2B, the second "A" region is shown assembled as islands in an array, e.g, either spherical micelles or surface-normal cylinders of material "A" within a matrix of material "B." Other assembly formations include rows, or similar energetically favorable configurations that segregate "A" regions apart from "B" regions.

Advantageously, in one example, the block copolymer 210 is a self-assembling coating. The "A" regions 202 arrange themselves apart from the "B" regions 206 by themselves when heated or otherwise activated. In one example, the substrate 201 is a silicon substrate, although other substrate materials such as germanium, gallium arsenide, etc. are also possible. Silicon substrates are readily available, and are useful to reduce cost of the resulting semiconductor device.

Figure 2C:
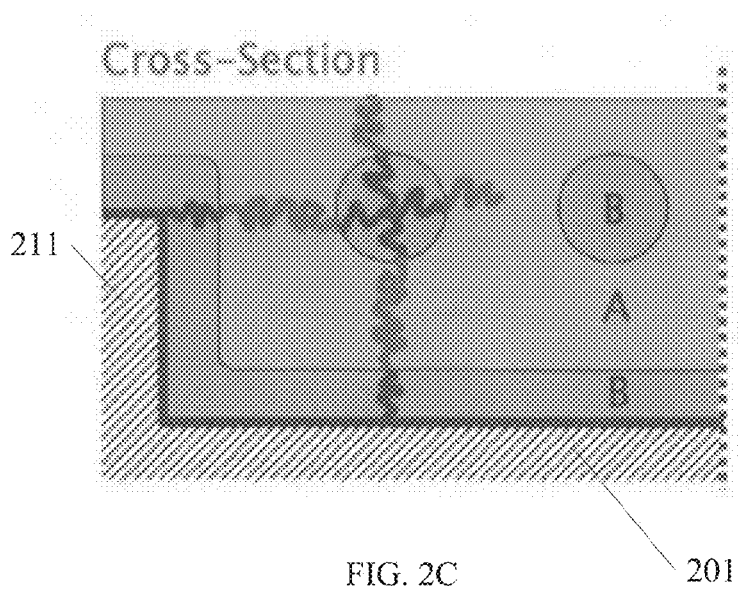
FIG. 2C shows a portion of a substrate during a manufacturing process according to an embodiment of the invention.

FIG. 2C illustrates the substrate 201, having an added geometric feature 210 in the substrate topography. In one example features 211, such as the sidewall shown in FIG. 2C, are etched into the substrate 201 prior to adding the block copolymer 210. As shown in FIG. 2C, in selected examples, the feature 211 is used to direct assembly of the block copolymer 210 by providing a guiding surface out of the horizontal plane of the substrate 201.

Figure 2D:
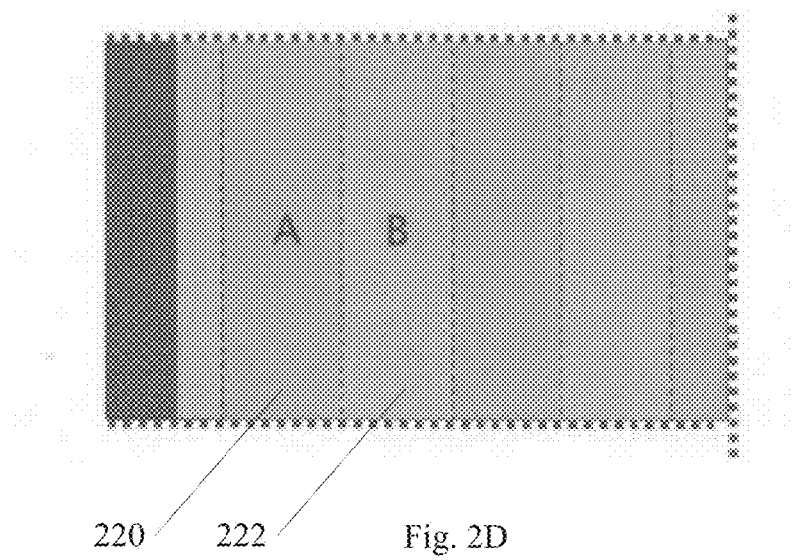
FIG. 2D shows a top view of a substrate during a manufacturing process according to an embodiment of the invention.

FIG. 2D illustrates an example of a top view of a self assembled block copolymer on a surface of the substrate 201. In the example shown, the block copolymer regions "A" and "B" are assembled into rows. As noted above, other examples of assembled patterns include, but are not limited to arrays of islands or grids.

Figure 3:
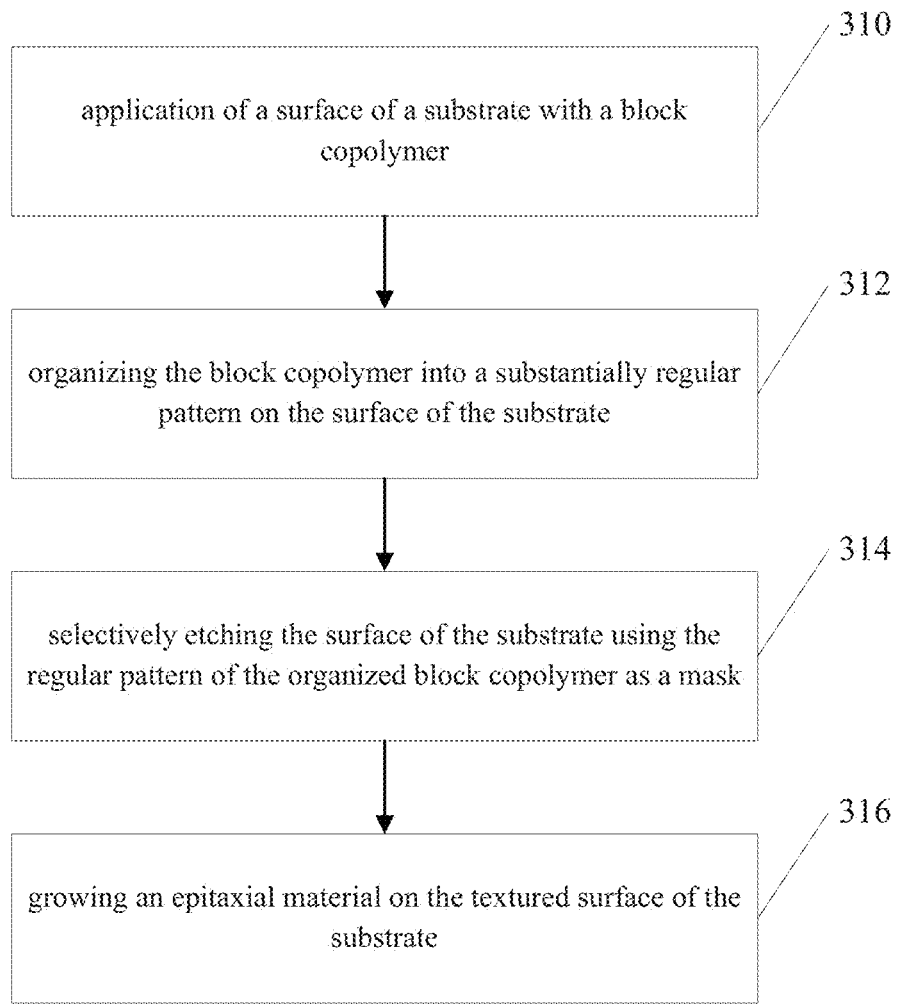
FIG. 3 shows a flow diagram of an example method according to an embodiment of the invention

In one example, block copolymers 210 and their assembled regular pattern are used to selectively etch the substrate 201. One example method of using block copolymers, as described above, to selectively etch and further form an epitaxial material on a substrate surface is shown in FIG. 3.

A block copolymer coating is deposited on a surface of a substrate in operation 310. In operation 312, the block copolymer coating organizes into a substantially regular pattern. Process conditions such as elevated temperature, time, a solvent anneal, etc. can be used to organize the block copolymer.

In operation 314, using polymer chemistry, or adding a dopant to "A" or "B" regions, etc., either the "A" region or the "B" region is selectively removed from the surface of the substrate, and the remaining region of the block copolymer coating is used as a mask in a subsequent etch process. A resulting textured surface is formed in the substrate. The textured surface corresponds to the regular pattern of the block copolymer coating, although it may not be identical. Depending on process conditions such as etchant chemistry, etch duration, etc., the textured surface may include pits, holes, or trenches with vertical sidewalls, angled sidewalls, or other geometries.

In operation 316, an epitaxial material is grown on the textured surface of the substrate. In one example specific geometries of the textured surface are used to promote high quality epitaxial material growth as will be discussed in more detail below.

Using block copolymers to mask and etch a substrate surface provides advantages, in contrast to other techniques such as optical lithography. The added process steps of forming an optical mask and exposing, developing, stripping, etc. of resist materials add cost to the manufacturing process. Using self-assembled block copolymers as an etch mask saves manufacturing steps. In addition, block copolymers are effective at forming nanometer scale textured surfaces on semiconductor substrates, at dimensions smaller than what is attainable with conventional photolithography.

Figure 4:
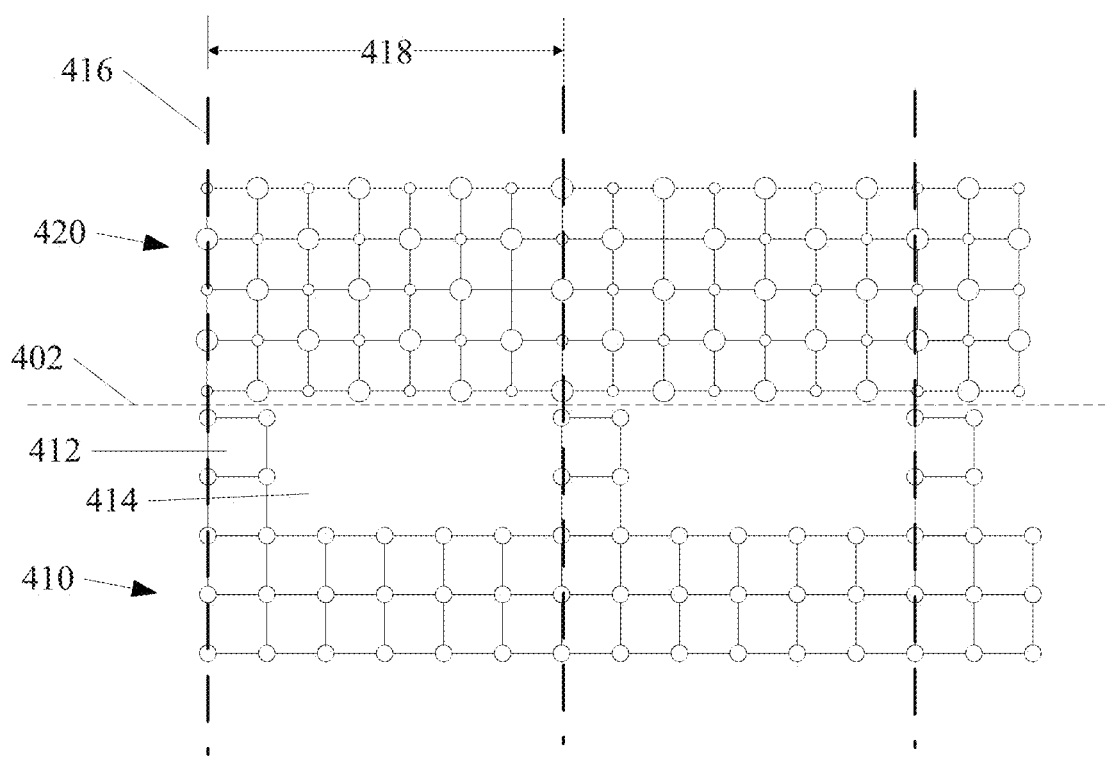
FIG. 4 shows an interface between two semiconductor materials according to an embodiment of the invention.

FIG. 4 illustrates one possible mechanism of textured surface geometry promoting high quality epitaxial material growth. A substrate lattice 410 such as silicon, is etched to form a surface texture using selected block copolymer methods described above. FIG. 4 illustrates a textured surface having a geometry that includes a number of islands 412 and a number of spaces 414 between the islands. In one example, a periodicity 418 of the islands 412 is selected to substantially reduce a lattice mismatch between the patterned substrate 410 and an epitaxial material 420.

As can be seen in FIG. 4, the atoms in the epitaxial material 420 do not match one to one with the atoms in the substrate 410, however the periodicity 418 helps align atoms at a particular interval to better reduce a lattice mismatch between the substrate 410 and the epitaxial material 420. Lines 416 shown in FIG. 4 illustrate how the atoms in contact at an interface 402, are substantially aligned. In one example, the periodicity 418 is selected to correspond to approximately +/−25% of an integer multiple of the lattice constant of the epitaxial material 420.

Figure 5:
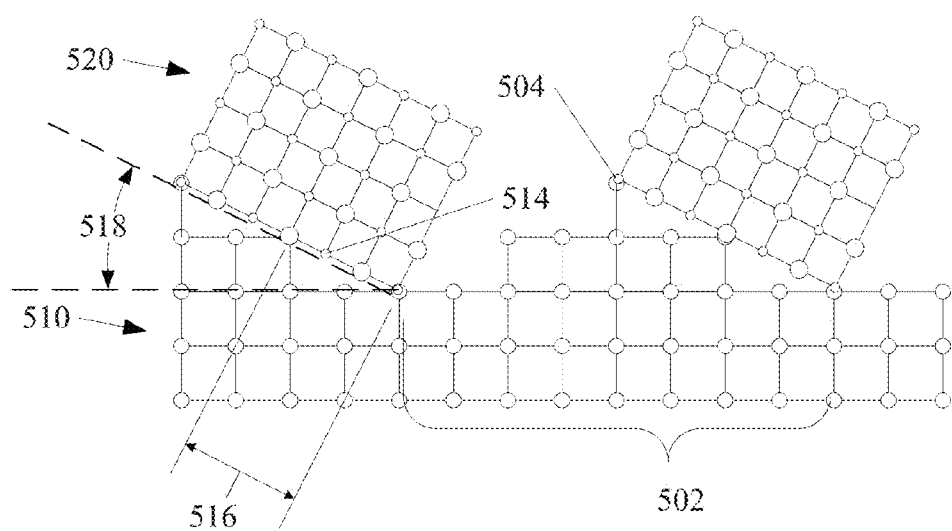
FIG. 5 shows another interface between two semiconductor materials according to an embodiment of the invention.

FIG. 5 illustrates another possible mechanism of textured surface geometry promoting high quality epitaxial material growth. A number of features 502 are etched into a surface of a substrate 510, using selected block copolymer methods described above. FIG. 5 is shown in cross section, so the three dimensional detail of the features 502 is not shown. Examples of features 502 include pyramids such as four-sided pyramids, or other numbers of sides, based on crystal structure of the substrate 510. Other examples of features 502 include conical shapes, with angled sides as shown. In other examples, the features 502 include rows with a cross section as shown in FIG. 5, the rows having angled sides. The features 502 form an apex 504 with angled surfaces 514 extending away from the apex 504. The angle 518 of the angled surfaces 514 is illustrated with respect to an average surface plane of the substrate 510.

The angled surfaces 514 create a modified lattice spacing 516 which substantially corresponds to a lattice spacing of alternate crystal planes in the substrate 510. The Figure illustrates how a properly chosen angle 518 results in a spacing 516 that substantially corresponds to a lattice spacing of an epitaxial material 520. The Figure further illustrates how a number of epitaxial material portions 520 are formed on angled surfaces of the substrate.

As epitaxial growth progresses, the multiple epitaxial material portions 520 will form together and create a substantially homogenous epitaxial material. Using the angled surfaces as shown, the interface between the substrate 510 and the epitaxial material includes improved lattice matching, and as a result decreases lattice defects in the epitaxial material and improves adhesion at the interface. Although only one angled surface 514 is shown with epitaxial growth for illustration, one of ordinary skill in the art will recognize that other angled surfaces will also include epitaxial growth. Additionally, although atomic scale is shown in the Figure for illustration, one of ordinary skill in the art will recognize that scale of features 502 and angled surfaces 514 in practice may be much larger.

Figure 6:
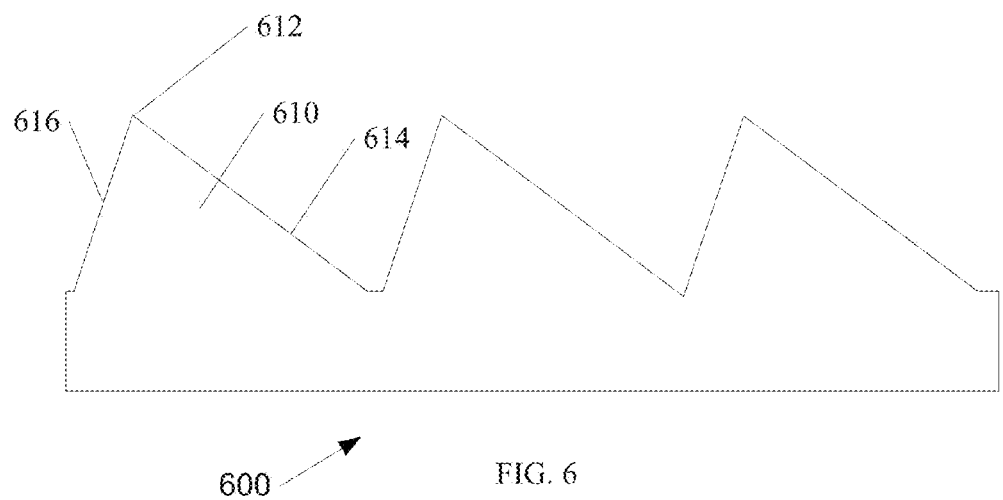
FIG. 6 shows another interface between two semiconductor materials according to an embodiment of the invention.

FIG. 6 illustrates another example of angled surfaces 614 on a substrate 610 with the atomic detail removed. In FIG. 6, one embodiment is illustrated that includes asymmetric angled surfaces with respect to apex 612. For example the surface 614 is shown at a more acute angle than surface 616, with respect to a horizontal plane of the substrate 610.

Figure 7:
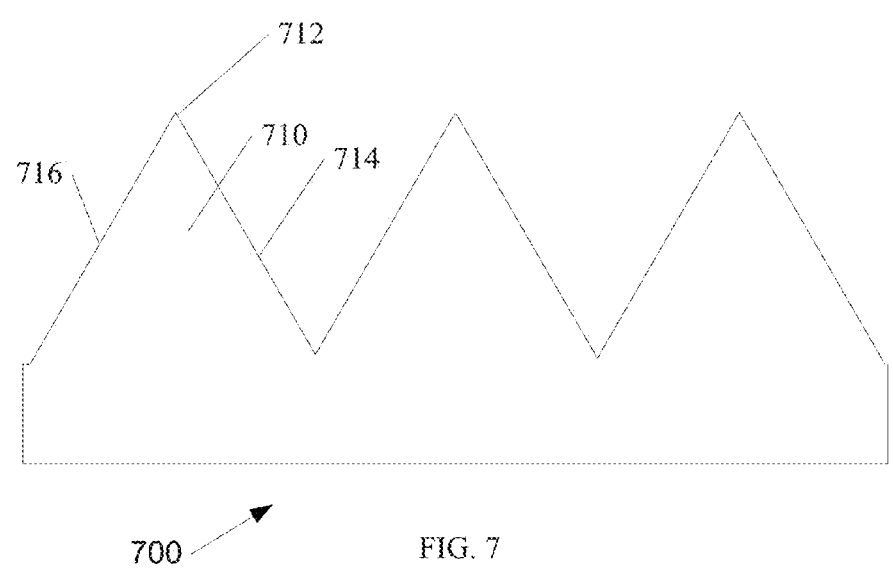
FIG. 7 shows another interface between two semiconductor materials according to an embodiment of the invention.

FIG. 7 illustrates another example of angled surfaces 700 on a substrate 710. Similar to the example illustrated in FIG. 5, in FIG. 7, the angled surfaces are symmetric with respect to apex 712. The surface 714 is shown at a substantially the same angle as surface 716, with respect to a horizontal plane of the substrate 710.

Figure 8:
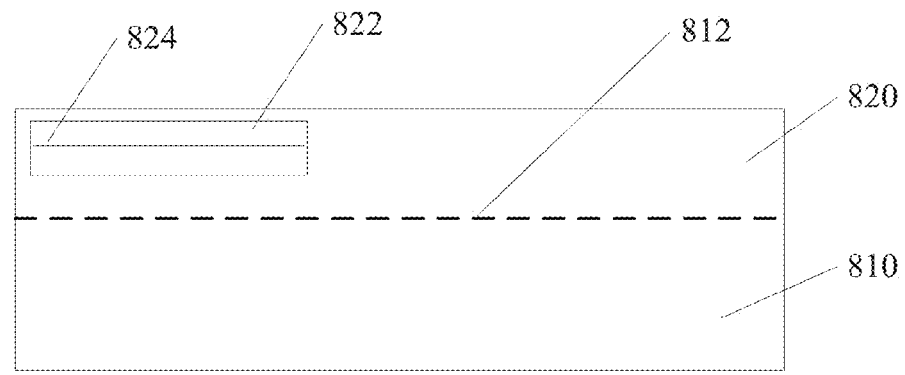
FIG. 8 shows a semiconductor device according to an embodiment of the invention.

FIG. 8 illustrates an example of a semiconductor device 800 formed using methods of patterning and texturing as described above. FIG. 8 shows a semiconductor substrate 810 with an epitaxial material 820 formed over the substrate 810. An interface 812 is shown between the substrate 810 and the epitaxial material 820. In one embodiment, the interface 812 is formed using block copolymer masking, as described above, to form a texture in the substrate. The texture facilitates improved quality and reduction in defects in the epitaxial material 820 as described above.

In one example the substrate 810 includes a silicon substrate. In one example the epitaxial material 820 includes a gallium nitride epitaxial material. One particular semiconductor device 800 that can be formed using methods described in the present disclosure includes an LED device. Gallium nitride is a useful material to form LEDs with selected wavelengths of light. FIG. 8 illustrates an LED 822 in block diagram form. A P-N junction 824 is illustrated as a functioning component of the LED 822. One of ordinary skill in the art, having the benefit of the present disclosure will recognize that any of a number of different geometries and circuit designs for LED 822 may be possible. The ability to form high quality epitaxial gallium nitride on silicon increases the quality of the LED semiconductor device 800 and reduces the cost.

Figure 9:
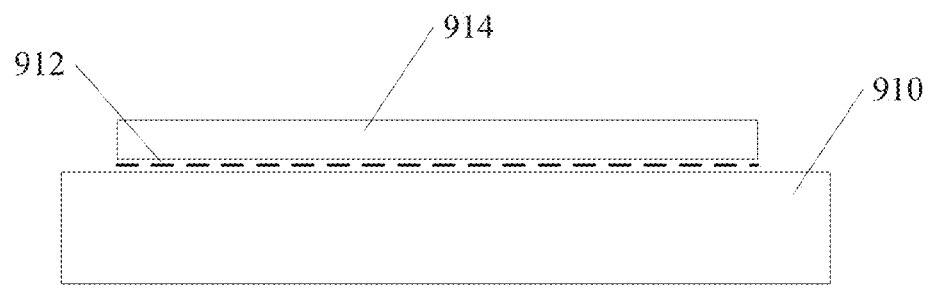
FIG. 9 shows another semiconductor device according to an embodiment of the invention.

FIG. 9 illustrates another example of a semiconductor device 900 formed using methods of patterning and texturing as described above. FIG. 9 shows a semiconductor substrate 910 with a textured surface 912 formed over at least a portion of the substrate 910. A liquid crystal media 914 is shown in contact with the textured surface 912 on the substrate 910. Examples of semiconductor devices 900 include liquid crystal displays. Using the cost effective methods of forming a texture on a substrate, as described above, a liquid crystal media performance is enhanced. In one example the textured surface facilitates improved organization of the liquid crystal media in response to an applied electric field. In other examples, a semiconductor substrate 910 with a textured surface 912 is used as a template in a manufacturing process of a liquid crystal device, in contrast to using the semiconductor substrate 910 directly with a liquid crystal media.

Figure 10:
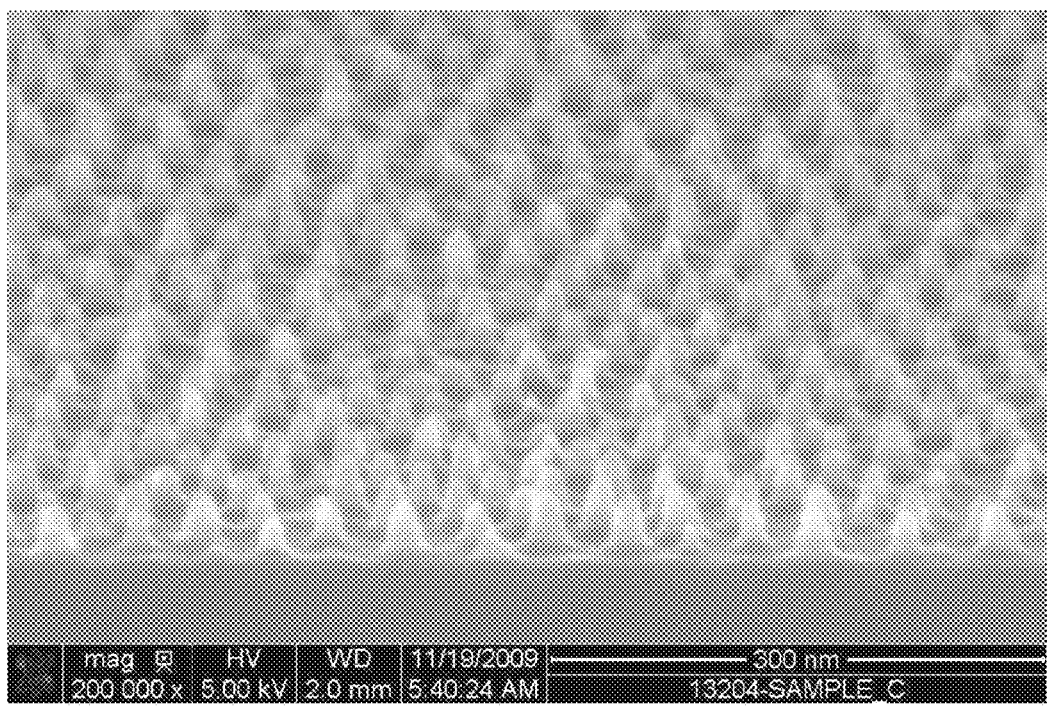
FIG. 10 shows a micrograph of a semiconductor surface according to an embodiment of the invention.
Figure 11:
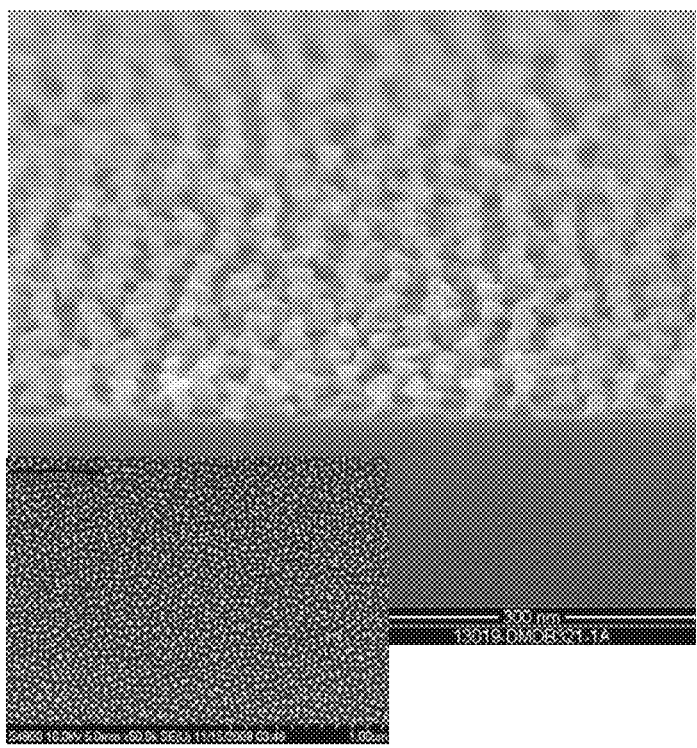
FIG. 11 shows a micrograph of a semiconductor surface according to an embodiment of the invention.

FIG. 10 shows a micrograph of a textured silicon surface formed using block copolymer masking as described in various embodiments above. Individual islands are shown having angled surfaces. FIG. 11 shows another micrograph of a textured silicon surface formed using block copolymer masking as described in various embodiments above. Embodiments such as shown in FIG. 11 can provide additional mechanical interlocking at an interface with an epitaxially grown material due to the enlarged heads of the islands formed.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A method of forming a light emitting diode device, comprising:
    applying a block copolymer to a silicon surface;
    organizing the block copolymer into a substantially regular pattern;
    selectively etching the silicon surface of using the regular pattern of the organized block copolymer as a mask to form a corresponding textured surface of the substrate;
    forming epitaxial gallium nitride on the textured surface, wherein a geometry of the textured surface reduces a lattice mismatch between the epitaxial gallium nitride and the silicon surface; and
    forming a P-N junction within the gallium nitride to provide a desired wavelength of light.

2. The method of claim 1, wherein selectively etching the silicon surface includes forming the textured surface so that a periodicity of the texture corresponds to a value within approximately +/−25% of an integer multiple of the lattice constant of the epitaxial gallium nitride.

3. The method of claim 1, wherein selectively etching the silicon surface includes forming the textured surface to include a number of regularly spaced pyramidal structures.

4. The method of claim 1, wherein selectively etching the silicon surface includes forming the textured surface to include a number of regularly spaced conical-shaped structures.

5. The method of claim 1, wherein selectively etching the silicon surface includes forming the textured surface to include a number of asymmetric angled surfaces.

6. A method of forming a light emitting diode device, comprising:
    applying a block copolymer to a semiconductor surface;
    organizing the block copolymer into a substantially regular pattern;
    selectively etching the semiconductor surface using the regular pattern of the organized block copolymer as a mask to form one or more angled surfaces within the semiconductor surface;
    forming an epitaxial material on the one or more angled surfaces; and
    forming a P-N junction within the epitaxial material to provide a desired wavelength of light.

7. The method of claim 6, wherein applying a block copolymer to the semiconductor surface includes applying a di-block copolymer.

8. The method of claim 6, wherein applying a block copolymer to the semiconductor surface includes applying a tri-block copolymer.

9. The method of claim 6, wherein applying a block copolymer to the semiconductor surface includes applying a block copolymer to a silicon surface.

10. The method of claim 6, wherein forming the epitaxial material on the one or more angled surfaces includes forming epitaxial gallium nitride on the one or more angled surfaces.

11. The method of claim 6, wherein selectively etching the semiconductor surface includes forming the textured surface to include a number of regularly spaced pyramidal structures.

12. The method of claim 6, wherein selectively etching the semiconductor surface includes forming the textured surface to include a number of regularly spaced conical-shaped structures.

13. The method of claim 6, wherein selectively etching the semiconductor surface includes forming the textured surface to include a number of asymmetric angled surfaces.

* * * * *